United States Patent [19]
Jiang et al.

[11] Patent Number: 6,021,146
[45] Date of Patent: Feb. 1, 2000

[54] VERTICAL CAVITY SURFACE EMITTING LASER FOR HIGH POWER SINGLE MODE OPERATION AND METHOD OF FABRICATION

[75] Inventors: Wenbin Jiang, Phoenix; Michael S. Lebby, Apache Junction; Jamal Ramdani, Gilbert, all of Ariz.

[73] Assignee: Motorola, Inc., Schaumburg, Ill.

[21] Appl. No.: 08/929,377

[22] Filed: Sep. 15, 1997

[51] Int. Cl.$^7$ ............................................. H01S 3/085
[52] U.S. Cl. ................................. 372/46; 372/96
[58] Field of Search ....................... 372/96, 46, 45

[56] References Cited

U.S. PATENT DOCUMENTS

| | | | |
|---|---|---|---|
| 4,873,696 | 10/1989 | Coldren et al. | 372/96 |
| 5,245,622 | 9/1993 | Jewell et al. | 372/96 |
| 5,568,499 | 10/1996 | Lear | 372/45 |
| 5,724,376 | 3/1998 | Kish Jr. et al. | 372/46 |

*Primary Examiner*—James W. Davie
*Attorney, Agent, or Firm*—Eugene A. Parsons; William E. Koch

[57] ABSTRACT

A VCSEL for high power single mode operation and method of fabrication including a substrate element, a first stack of distributed Bragg reflectors disposed on a surface of the substrate element, an active region lattice matched to a surface of the first stack of distributed Bragg reflectors, and a second stack of distributed Bragg reflectors lattice matched to a surface of the active region. The VCSEL structure includes an enhanced conductivity region formed within a central portion of the second stack of distributed Bragg reflectors and within the laser emission path. The enhanced conductivity region is defined by either zinc diffusion or beryllium implants. An electrical contact is coupled to a surface of the second stack of distributed Bragg reflectors and an electrical contact is positioned a surface of the substrate element.

17 Claims, 1 Drawing Sheet

VERTICAL CAVITY SURFACE EMITTING LASER FOR HIGH POWER SINGLE MODE OPERATION AND METHOD OF FABRICATION

FIELD OF THE INVENTION

This invention relates to vertical cavity surface emitting lasers and more specifically to vertical cavity surface emitting lasers for high power single mode operation.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In conventional VCSELs, conventional material systems perform adequately. However, new products are being developed, such as CD write devices and those utilizing infrared data links, that require VCSELs to operate in a high power single mode. In general, VCSELs typically operate in a multimode due to carrier spatial hole burning and ring p-side metal contact induced current crowding effect. Such a carrier distribution will support multimode operation due to higher modal gain for high order modes. In that single mode operation is sought, some way must be adopted to fill the hole in the carrier distribution so that the single mode beam will see a higher modal gain.

Thus, there is a need for developing a reliable, stable and cost effective vertical cavity surface emitting laser (VCSEL) for use in high power single mode operations, that includes improved carrier distribution so as to allow for single mode beam operation with higher modal gain.

It would be highly advantageous, therefore, to remedy the foregoing and other deficiencies inherent in the prior art. Accordingly, it is an object of the present invention to provide a new and improved VCSEL for use in high power single mode operations.

Another object of the invention is to provide a reliable high power single mode VCSEL.

And another object of the immediate invention is to provide for efficient carrier distribution in a high power single mode VCSEL.

Still another object of the invention is to provide for a higher model gain in a high power single mode VCSEL.

Yet another object of the invention is to provide for a highly manufacturable high power single mode VCSEL.

SUMMARY OF THE INVENTION

Briefly, to achieve the desired objects of the instant invention in accordance with a preferred embodiment thereof, provided is a VCSEL for use in high power single mode operation. The VCSEL generally includes a substrate, a first stack of distributed Bragg reflectors, an active region, and a second stack of distributed Bragg reflectors. In a preferred embodiment, the central portion of the p-DBR, within the light emission path, is highly doped by zinc (Zn) diffusion or contains beryllium (Be) implantations, thereby defining an enhanced conductivity area. This enhanced conductivity area will allow for more current injection into the central area of the active region, thereby reducing spatial hole burning and current crowding effect.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
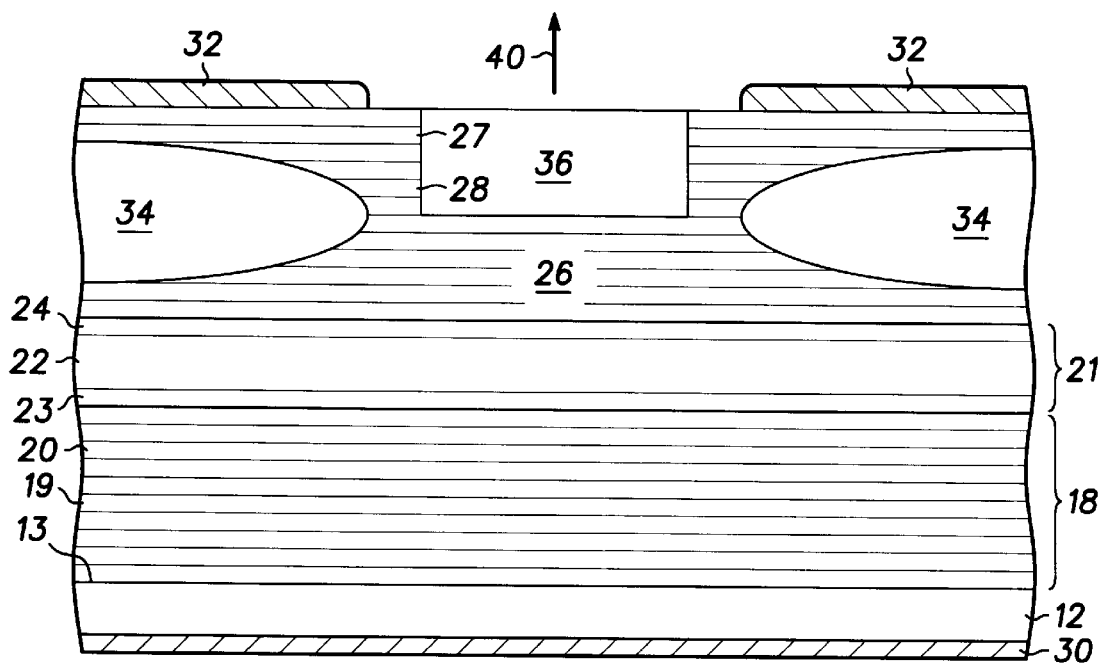
FIG. 1 is a sectional view of a first VCSEL planar structure in accordance with the present invention.

Turning now to the drawings in which like reference characters indicate corresponding elements throughout the several views, attention is first directed to FIG. 1 which illustrates the fabrication of a first vertical cavity surface emitting laser (VCSEL) wafer structure, or VCSEL device, generally designated 10. Wafer structure, or device, 10 in this particular embodiment is formed as a planar wafer structure. Wafer structure 10 is formed on a substrate 12, which in this specific embodiment is gallium arsenide (GaAs). GaAs is preferably used to facilitate lattice matching of the components of wafer structure 10 which in this particular embodiment emits infrared wavelength light, more particularly light in a range of 780 nm to 850 nm, dependent upon the specific material system used. A GaAs substrate is utilized so as to facilitate epitaxial growth of subsequent multiple layers that compose wafer structure 10. It should be understood that GaAs is only utilized as an example and other semiconductor materials may be employed as substrate 12, such as silicon (Si), indium phosphide (InP), or the like. Additionally, dependent upon material system, any wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 10. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise the complete VCSEL device of the present invention.

Substrate 12 has an upper surface 13 on which a first mirror stack 18 is disposed. An active region 21 is disposed on mirror stack 18. Active region 21 includes an active structure 22 sandwiched between a first cladding region 23 adjacent first mirror stack 18 and a second cladding region 24. A second mirror stack 26 is disposed on second cladding region 24.

Referring now to distributed Bragg reflectors 18 and 26, it should be understood that distributed Bragg reflector 18 is deposited first with subsequent deposition defining cladding region 23, active structure 22, cladding region 24, and distributed Bragg reflector 26. Distributed Bragg reflectors 18 and 26 are each composed of a plurality of layers, 19, 20, 27 and 28, respectively. Generally, thicknesses of alternating layers 19, 20, 27, and 28 are typically set as portions of a wavelength of light (not shown) that the complete VCSEL device is designed to emit. Thus, specific thicknesses of the alternating layers 19, 20, 27 and 28 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of the distributed Bragg reflectors 18 and 26 is split with one of the distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, distributed Bragg reflector 18 and a portion of cladding region 23 are N-type doped, with a portion of cladding region 23, active structure 22, and a portion of cladding region 24 being undoped, and with a portion of cladding region 24, and distributed Bragg reflector 26 being P-type doped.

In the present invention, distributed Bragg reflectors 18 and 26 having alternating layers 19, 20, 27 and 28 are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that the second stack of distributed Bragg reflectors can alternatively include a plurality of pairs of alternating layers of a dielectric material to be deposited as a final step in the device fabrication process.

More specifically, a VCSEL structure designed to emit at 780 nm will include alternating layers 19, 20, 27, and 28 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 19, 20, 27 and 28 of $Al_{0.15}Ga_{0.85}As/Al_{0.85}Ga_{0.15}As$. Irrespective of the material system utilized, layers 19 and 20 are epitaxially disposed or deposited on or overlaying substrate 12 and layers 27 and 28 are epitaxially disposed or deposited on or overlaying cladding region 24, thereby generating distributed Bragg reflectors 18 and 26. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), and indium aluminum gallium phosphide and indium aluminum phosphide (e.g., $In_{0.49}Al_xGa_{0.51-x}P/In_{0.49}Al_{0.5}P$) are anticipated by this disclosure for the device to operate at red visible emission wavelength (635–700 nm) in association with an appropriate active medium. Additionally, it should be understood that in each of the above examples and throughout this disclosure where a percent composition of a particular element is given it should be considered only as an example. It should be further understood that variations from these examples can be large and are to be considered part of the present invention.

Mirror stack 18 and 26 are formed by depositing pairs of alternating layers using some convenient technique such as molecular beam epitaxy (MBE) or sputtering. In order to crystal lattice match mirror stack 18 to substrate 12 a suitable semiconductor material system must be deposited. Approximately 20–40 mirror pairs of this material system are deposited on substrate 12 depending on the difference between the refractive indices of the layers. As will be explained presently, substrate doping is not necessary since electrical contacts to the active region can be made laterally to doped mirror stack 18.

For the sake of simplicity and to prevent overcrowding of the figure, cladding region 23 is shown as a single layer; however, it should be understood that cladding region 23 is made of at least two components that are epitaxially disposed or deposited on distributed Bragg reflector 18. First, a layer of any suitable material such as aluminum gallium arsenide (AlGaAs) having an appropriate thickness and being doped similarly to distributed Bragg reflector 18 is epitaxially deposited on distributed Bragg reflector 18.

By way of example, a N-doped aluminum gallium arsenide layer $(Al_{0.60}Ga_{0.40}As)$ is epitaxially deposited on distributed Bragg reflector 18. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 23.

For the sake of simplicity, active structure 22 is represented by a single layer which is epitaxially deposited or disposed on cladding region 23; however, it should be understood that the active structure 22 can include multiple layers of barrier regions with quantum well regions interspersed. By way of a simple example, active structure 22 is made of at least two barrier layers and a quantum well region with the quantum well region being positioned between the barrier regions. In a preferred embodiment, active structure 22 is made of four barrier regions and three quantum well regions with the quantum well region being positioned between the two barrier regions. In a VCSEL structure that emits at 780 nm, the quantum well region(s) is made of undoped aluminum gallium arsenide $(Al_{0.12}Ga_{0.88}As)$ and the barrier regions are made of aluminum gallium arsenide $(Al_{0.30}Ga_{0.70}As)$. In a VCSEL structure that emits at 850 nm, the quantum well region(s) is made of undoped gallium arsenide (GaAs) and the barrier regions are made of aluminum gallium arsenide $(Al_{0.30}Ga_{0.70}As)$. Typically, active structure 22 includes three to five quantum wells with their corresponding barrier regions. One skilled in the art will understand that more or fewer quantum well layers and barrier layers can be used depending upon the application.

Active region 21 and first and second mirror stacks 18 and 26 respectively are configured to emit light with a wavelength of approximately 780 nm or 850 nm.

For the sake of simplicity and to prevent overcrowding of the figure, cladding region 24 is shown as a single layer; however, it should be understood that cladding region 24 is made of two components that are disposed or deposited epitaxially on active structure 22. First, a layer of any suitable undoped cladding material is epitaxially deposited to an appropriate thickness on active structure 22. Second, a layer of any suitable doped cladding material is epitaxially deposed on the undoped cladding material.

By way of example, an undoped aluminum gallium arsenide ($Al_{0.30}Ga_{0.70}As$) layer is epitaxially deposited on active structure 22. Generally, the undoped AlGaAs has a thickness that is determined by the wavelength of light that is to be emitted from the VCSEL device, thereby allowing the thickness of the AlGaAs layer to be any suitable thickness. Subsequently, a doped alluminum gallium arsenide ($Al_{0.60}Ga_{0.40}As$) layer is epitaxially deposited on the undoped layer. The doped layer is generally doped with a P-type dopant.

Next, the device, or wafer structure, 10 is selectively implanted with protons ($H^+$) to define the current flow path within the device. To accomplish this, the area in which implantation is not sought is masked using a dot array mask composed of Ti:W, gold, a dielectric material, a photoresist material, or their combination. The proton implants are completed with an energy of 300–400 kV. Once implanted, the device is annealed to cure any lattice defects and the dot array mask is removed.

To further aid in carrier confinement in device 10, next the central portion of distributed Bragg reflector 26, specifically within the light emission path, is highly doped so as to define an enhanced conductivity area 36. Enhanced conductivity area 26 is doped utilizing zinc (Zn) diffusion or beryllium (Be) implants with the aid of a dielectric or photoresist circular mask. This doping allows for greater conductivity in the central portion of distributed Bragg reflector 26. Accordingly, more current will be injected into the central area of active region 21, in that the current will tend to funnel toward this center portion, thereby reducing the spatial hole burning and current crowding effect. With less spatial hole burning effect in the carrier distribution in active region 21, higher single mode power can be generated by device 10 due to its higher modal gain.

To complete wafer structure, or device, 10 the circular mask is removed and an electrical contact 30 is coupled to a surface of substrate 12. A second electrical contact 32 is coupled to distributed Bragg reflector 26. Light 40 is emitted from device 10 in a direction opposite substrate 12. Due to the use of the diffusion or implants (previously described), high power single mode operation of greater than 5 milliwatts is now achievable. Various changes and modifications to the embodiments herein chosen for purposes of illustration will readily occur to those skilled in the art. For example, it should be understood that VCSEL structure symmetry exists for both the p and n dopants as well as electrically inverted structure designs.

Figure 2:
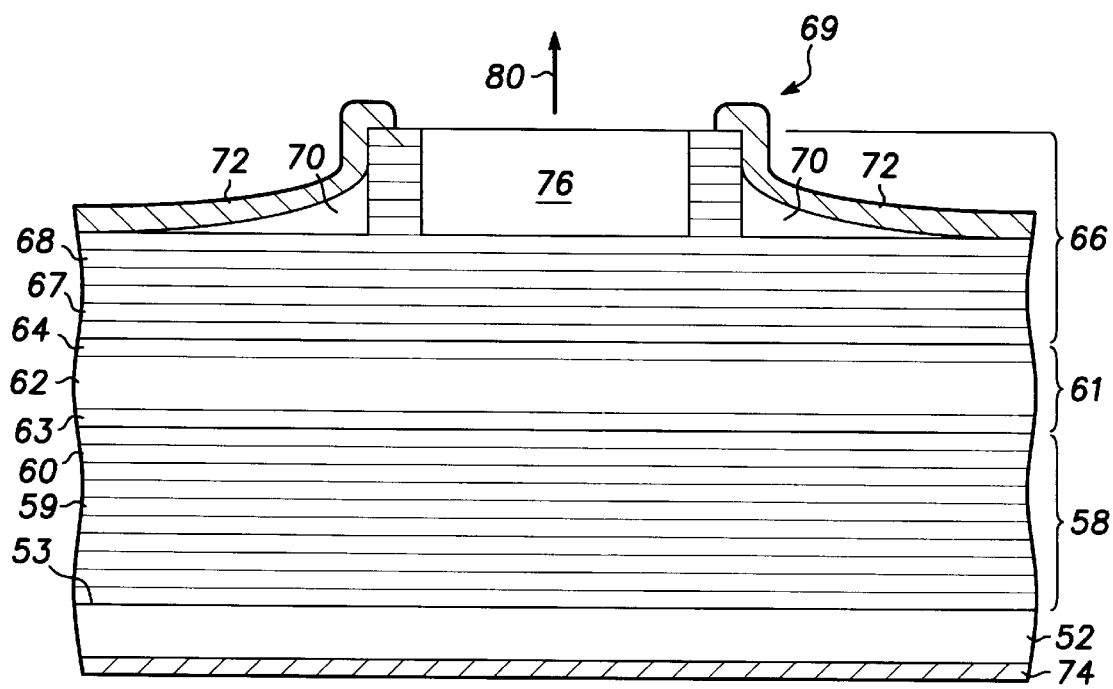
FIG. 2 is a sectional view of a second VCSEL ridge waveguide structure in accordance with the present invention.

Referring now to FIG. 2, a second wafer structure, or device, 50 is disclosed. Wafer structure, or device, 50 is generally similar to wafer structure, or device, 10 previously disclosed, except in this particular embodiment, wafer structure 50 is defined as a ridge wave guide wafer structure. Wafer structure 50 is formed on a substrate 52, which in this specific embodiment is gallium arsenide (GaAs). GaAs is preferably used to facilitate lattice matching of the components of wafer structure 50 which in this particular embodiment emits infrared wavelength light, more particularly 780 nm or 850 nm light, dependent upon the specific material system used. Also, GaAs is utilized so as to facilitate epitaxial growth of subsequent multiple layers that compose wafer structure 50. It should be understood that GaAs is only utilized as an example and other semiconductor materials may be employed as substrate 52, such as silicon (Si), indium phosphide (InP), or the like.

Typically, any suitable epitaxial deposition method, such as molecular beam epitaxy (MBE), metal organic chemical vapor deposition (MOCVD), or the like is used to make the required multiple layers for wafer structure 50. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise the complete VCSEL device of the present invention.

Substrate 52 has an upper surface 53 on which a first mirror stack 58 is disposed. An active region 61 is disposed on mirror stack 58. Active region 61 includes an active structure 62 sandwiched between a first cladding region 63 adjacent first mirror stack 58 and a second cladding region 64. A second mirror stack 66 is disposed on second cladding region 64.

Referring now to distributed Bragg reflectors 58 and 66, it should be understood that distributed Bragg reflector 58 is deposited first with subsequent deposition defining cladding region 63, active structure 62, cladding region 64, and distributed Bragg reflector 66. Distributed Bragg reflectors 58 and 66 are each composed of a plurality of layers, 59, 60, 67 and 68, respectively. Generally, thicknesses of alternating layers 59, 60, 67, and 68 are typically set as portions of a wavelength of light (not shown) that the complete VCSEL device is designed to emit. Thus, specific thicknesses of the alternating layers 59, 60, 67 and 68 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of the distributed Bragg reflectors 58 and 66 is split with one of the distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, distributed Bragg reflector 58 and a portion of cladding region 63 are N-type doped, with a portion of cladding region 63, active structure 62, and a portion of cladding region 64 being undoped, and with a portion of cladding region 64, and distributed Bragg reflector 66 being P-type doped.

In the present invention, distributed Bragg reflectors 58 and 66 having alternating layers 59 and 60, 67 and 68 are made of any suitable materials, such as aluminum gallium arsenide (AlGaAs) with the aluminum percentage ranging from 0 to 100% or materials forming a dielectric mirror stack. More specifically, a VCSEL structure designed to emit at 780 nm will include alternating layers 59, 60, 67, and 68 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 59, 60, 67 and 68 of $Al_{0.15}Ga_{0.85}As/Al_{0.85}Ga_{0.15}As$. Irrespective of the material system utilized, layers 59 and 60 are epitaxially disposed or deposited on or overlaying substrate 52 and layers 67 and 68 are epitaxially disposed or deposited on or overlaying cladding region 24, thereby generating distributed Bragg reflectors 58 and 66. It should be understood that while AlGaAs/AlAs DBR structures are utilized in this particular embodiment, alternative DBR structures utilizing materials such as indium aluminum gallium phosphide and aluminum arsenide (e.g., $In_{0.49}Al_xGa_{0.51-x}P/AlAs$), and indium aluminum gallium phosphide and indium aluminum phosphide (e.g., $In_{0.49}Al_xGa_{0.51-x}P/In_{0.49}Al_{0.5}P$) are anticipated by this disclosure. Additionally, it should be understood that in each of the above examples and throughout this disclosure where a percent composition of a particular element is given it should be considered only as an example. It should be further understood that variations from these examples can be large and are to be considered part of the present invention.

Mirror stack 58 and 66 are formed by depositing pairs of alternating layers using some convenient technique such as molecular beam epitaxy (MBE) or sputtering. In order to crystal lattice match mirror stack 58 to substrate 52 a suitable semiconductor material system must be deposited. Approximately 20–40 mirror pairs of this material system are deposited on substrate 52 depending on the difference between the refractive indices of the layers. As will be explained presently, substrate doping is not necessary since electrical contacts to the active region can be made laterally to the n-doped DBR mirror stack.

For the sake of simplicity and to prevent overcrowding of the figure, cladding region 63 is shown as a single layer; however, it should be understood that cladding region 63 is made of at least two components that are epitaxially disposed or deposited on distributed Bragg reflector 58. First, a layer of any suitable material such as aluminum gallium arsenide (AlGaAs) having an appropriate thickness and being doped similarly to distributed Bragg reflector 58 is epitaxially deposited on distributed Bragg reflector 58.

By way of example, a N-doped aluminum gallium arsenide layer ($Al_{0.60}Ga_{0.40}As$) is epitaxially deposited on distributed Bragg reflector 58. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material having an appropriate thickness is epitaxially deposited on the first layer of the cladding region 63.

For the sake of simplicity, active structure 62 is represented by a single layer which is epitaxially deposited or disposed on cladding region 23; however, it should be understood that the active structure 62 can include multiple layers of barrier regions with quantum well regions interspersed. By way of a simple example, active structure 62 is made of at least two barrier layers and a quantum well region with the quantum well region being positioned between the two barrier regions. In a preferred embodiment, active structure 62 is made of four barrier regions and three quantum well regions with the quantum well region being positioned between the two barrier regions. In a VCSEL structure that emits at 780 nm, the quantum well region(s) is made of undoped aluminum gallium arsenide ($Al_{0.12}Ga_{0.88}As$) and the barrier regions are made of aluminum gallium arsenide ($Al_{0.30}Ga_{0.70}As$). In a VCSEL structure that emits at 850 nm, the quantum well region(s) is made of undoped gallium arsenide (GaAs) and the barrier regions are made of aluminum gallium arsenide ($Al_{0.30}Ga_{0.70}As$). Typically, active structure 62 includes three to five quantum wells with their corresponding barrier regions. One skilled in the art will understand that more or fewer quantum well layers and barrier layers can be used depending upon the application. Active region 61 and first and second mirror stacks 58 and 66 respectively are configured to emit light with a wavelength of approximately 780 nm or 850 nm.

For the sake of simplicity and to prevent overcrowding of the figure, cladding region 64 is shown as a single layer; however, it should be understood that cladding region 64 is made of two components that are disposed or deposited epitaxially on active structure 62. First, a layer of any suitable undoped cladding material is epitaxially deposited to an appropriate thickness on active structure 62. Second, a layer of any suitable doped cladding material is epitaxially layer is deposed on the undoped cladding material.

By way of example, an undoped aluminum gallium arsenide ($Al_{0.30}Ga_{0.60}As$) layer is epitaxially deposited on active structure 62. Generally, the undoped AlGaAs has a thickness that is determined by the wavelength of light that is to be emitted from the VCSEL device, thereby allowing the thickness of the AlGaAs layer to be any suitable thickness. Subsequently, a doped alluminum gallium aresenide ($Al_{0.60}Ga_{0.40}As$) layer is epitaxially deposited on the undoped layer. The doped layer is generally doped with a P-type dopant.

Next, the device, or wafer structure, 50 is selectively etched to define a ridge wave guide, or mesa, structure 69 to define the current flow within the device. A protection layer 70 of a dielectric material, such as silicon nitride (SiN) is deposited on the sides defining mesa structure 69. Next, to further aid in carrier confinement in device 50, the central portion of distributed Bragg reflector 66, specifically within the light emission path, is highly doped by zinc (Zn) diffusion or beryllium (Be) implants utilizing a dielectric or photoresist circular mask, thereby defining an enhanced conductivity area 76. This doping allows for greater conductivity in the central portion of distributed Bragg reflector 66. Accordingly, more current will be injected into the central area of active region 61, in that the current will tend to funnel toward this center portion, thereby reducing the spatial hole burning and current crowding effect. With less spatial hole burning effect in the carrier distribution in active region 61, higher single mode power can be generated by device 50.

To complete wafer structure, or device, 50 the circular mask is removed. It should be understood that when a dielectric material circular mask is used, that once removed, protection layer 70 will also be removed, in that it is also formed of a dielectric material. In this instance, another protection layer composed of a dielectric material will need to be deposited on the sides defining mesa structure 69. Next, an electrical contact 72 is deposited on protection layer 70 and coupled to distributed Bragg reflector 66. A second electrical contact 74 is coupled to a surface of substrate 52. Light 80 is emitted from device 50 in a direction opposite substrate 52. Due to the use of the diffusion or implants (previously described), high power single mode operation is now achievable. Various changes and modifications to the embodiments herein chosen for purposes of illustration will readily occur to those skilled in the art. For example, it should be understood that VCSEL structure symmetry exists for both the p and n dopants as well as electrically inverted structure designs.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser device comprising:

a substrate having a surface;

a first stack of distributed Bragg reflectors including a plurality of layers disposed on the surface of the substrate;

an active region disposed on the first stack of distributed Bragg reflectors;

a second stack of distributed Bragg reflectors including a plurality of layers disposed on the active region; and an enhanced conductivity area formed in a central portion of the uppermost plurality of layers of the second stack of distributed Bragg reflectors.

2. A vertical cavity surface emitting laser device as claimed in claim 1 wherein the laser is configured for high power single mode operation of greater than 5 milliwatts.

3. A vertical cavity surface emitting laser device as claimed in claim 2 wherein the laser is defined by a planar wafer structure.

4. A vertical cavity surface emitting laser device as claimed in claim 2 wherein the laser is defined by a ridge wave guide wafer structure.

5. A vertical cavity surface emitting laser device as claimed in claim 2 wherein the active region and the first and the second stacks of distributed Bragg reflectors are configured to emit light with a wavelength in a range of approximately 780 nm to 850 nm.

6. A vertical cavity surface emitting laser device as claimed in claim 2 wherein the enhanced conductivity area is formed by zinc diffusion.

7. A vertical cavity surface emitting laser device as claimed in claim 2 wherein the enhanced conductivity area is formed of beryllium implants.

8. A vertical cavity surface emitting laser device as claimed in claim 2 wherein the first stack of distributed Bragg reflectors and the second stack of distributed Bragg reflectors each include a plurality of pairs of alternating layers of an $Al_{x1}Ga_{1-x1}As/Al_{x2}Ga_{1-x2}As$ material system.

9. A vertical cavity surface emitting laser device as claimed in claim 8 where x1 ranges from 0 to 50% and x2 ranges from 50 to 100%.

10. A vertical cavity surface emitting laser device as claimed in claim 2 wherein the first stack of distributed Bragg reflectors includes a plurality of pairs of alternating layers of a $Al_{x1}Ga_{1-x1}As/Al_{x2}Ga_{1-x2}As$ material and the second stack of distributed Bragg reflectors includes a plurality of pairs of alternating layers of a dielectric material.

11. A vertical cavity surface emitting laser device as claimed in claim 10 where x1 ranges from 0 to 50% and x2 ranges from 50 to 100%.

12. A vertical cavity surface emitting laser device comprising:

a substrate having a surface;

a first stack of distributed Bragg reflectors including a plurality of pairs of alternating layers disposed on the surface of the substrate, the first stack of distributed Bragg reflectors having a surface;

an active region having a first and a second surface and including an active structure sandwiched between a first cladding region and a second cladding region, the active region being lattice matched to the surface of the first stack of distributed Bragg reflectors;

a second stack of distributed Bragg reflectors lattice matched to the second surface of the active region and including a plurality of pairs of alternating layers; and an enhanced conductivity region formed in an uppermost central portion of the plurality of pairs of alternating layers of the second stack of distributed Bragg reflectors.

13. A vertical cavity surface emitting laser device as claimed in claim 12 wherein the laser is configured for high power single mode operation of greater than 5 milliwatts.

14. A vertical cavity surface emitting laser device as claimed in claim 13 wherein the active region and the first and the second stacks of distributed Bragg reflectors are configured to emit light with a wavelength of approximately 780 nm.

15. A vertical cavity surface emitting laser device as claimed in claim 13 wherein the active region and the first and the second stacks of distributed Bragg reflectors are configured to emit light with a wavelength of approximately 850 nm.

16. A vertical cavity surface emitting laser device as claimed in claim 13 wherein the enhanced conductivity region is formed by zinc diffusion.

17. A vertical cavity surface emitting laser device as claimed in claim 13 wherein the enhanced conductivity region is formed of beryllium implants.

* * * * *